US011756858B2

(12) United States Patent
Han et al.

(10) Patent No.: US 11,756,858 B2
(45) Date of Patent: Sep. 12, 2023

(54) POWER MODULE WITH HOUSING HAVING BENDING SECTIONS

(71) Applicants: Industrial Technology Research Institute, Hsinchu (TW); DIODES TAIWAN S.A R.L., New Taipei (TW)

(72) Inventors: Wei-Kuo Han, Hsinchu (TW); Chia-Yen Lee, Taoyuan (TW); Jing-Yao Chang, New Taipei (TW); Tao-Chih Chang, Taoyuan (TW)

(73) Assignees: Industrial Technology Research Institute, Hsinchu (TW); DIODES TAIWAN S.A R.L., New Taipei (TW)

( * ) Notice: Subject to any disclaimer, the term of this patent is extended or adjusted under 35 U.S.C. 154(b) by 363 days.

(21) Appl. No.: 17/140,145

(22) Filed: Jan. 4, 2021

(65) Prior Publication Data

US 2021/0210409 A1    Jul. 8, 2021

Related U.S. Application Data

(60) Provisional application No. 62/957,278, filed on Jan. 5, 2020.

(30) Foreign Application Priority Data

Jun. 4, 2020   (TW) .................................. 109118729

(51) Int. Cl.
*H01L 23/40*   (2006.01)
(52) U.S. Cl.
CPC .................................... *H01L 23/40* (2013.01)
(58) Field of Classification Search
CPC ...................................................... H01L 23/40

(Continued)

(56) References Cited

U.S. PATENT DOCUMENTS 7,477,518 B2    1/2009  Stolze et al.
7,719,092 B2    5/2010  Takubo
(Continued)

FOREIGN PATENT DOCUMENTS

| CN | 106206459 | 12/2016 |
| CN | 209029364 | 6/2019 |
| TW | I557857 | 11/2016 |

OTHER PUBLICATIONS

"Office Action of Taiwan Counterpart Application", dated Jan. 29, 2021, p. 1-p. 12.

*Primary Examiner* — Ajay Arora
(74) *Attorney, Agent, or Firm* — JCIPRNET (57) ABSTRACT

A power module including a main housing, a power element, and at least one assembling component is provided. The main housing has at least one side wall and at least two ribs extending from the side wall. The power element is disposed in the main housing and is closely pressed against a heat dissipation structure by the side wall. The assembling component includes a main section and two bending sections. The main section is located between the two ribs and includes a central portion, at least one movable component, and a peripheral portion. The central portion has a fastening portion, the peripheral portion surrounds the central portion, and the movable component is connected between the central portion and the peripheral portion. The two bending sections are respectively connected to two opposite sides of the peripheral portion and are respectively embedded in the two ribs.

22 Claims, 7 Drawing Sheets

(58) Field of Classification Search
USPC .......................................................... 257/719
See application file for complete search history.

(56) References Cited

U.S. PATENT DOCUMENTS

| | | | |
|---|---|---|---|
| 9,967,986 B2 | 5/2018 | Prajuckamol et al. | |
| 10,319,652 B2 | 6/2019 | Lin et al. | |
| 2008/0084811 A1* | 4/2008 | Kajino | G11B 7/1275 |
| 2014/0285972 A1 | 9/2014 | Hong et al. | |
| 2014/0285973 A1* | 9/2014 | Hong | H05K 5/0221 |
| | | | 361/709 |
| 2019/0006262 A1 | 1/2019 | Lewin et al. | |

* cited by examiner

POWER MODULE WITH HOUSING HAVING BENDING SECTIONS

CROSS-REFERENCE TO RELATED APPLICATION

This application claims the priority benefit of U.S. provisional application Ser. No. 62/957,278, filed on Jan. 5, 2020, and Taiwan application serial no. 109118729, filed on Jun. 4, 2020. The entirety of each of the above-mentioned patent applications is hereby incorporated by reference herein and made a part of this specification.

BACKGROUND

Technical Field

The disclosure relates to an electronic module, and in particular, to a power module.

Description of Related Art

In recent years, the manufacturing techniques of power semiconductors have developed rapidly, so that the functions of electronic components have significantly improved. As the processing speed and current of the electronic component increase, the amount of heat generated during operation of the electronic component also increases. If the waste heat cannot be effectively removed, the electronic component may fail or cannot achieve the optimal performance.

For a power chip, when operating, the generated heat will cause thermal deformation of the structure of the power element and thus affect the heat transfer effect. As a result, the temperature of the power chip is increased and the service life is decreased. To effectively dissipate the heat of a power chip, some power modules have been designed to be fastened to a heat dissipation structure, so that the substrate of the power chip therein can stably contact the heat dissipation structure. Furthermore, if the power module fails to be properly fastened and is skewed, the substrate of the power chip will not be able to properly contact the heat dissipation structure, which reduces the heat dissipation efficiency.

SUMMARY

The disclosure provides a power module, which can allow a substrate of a power chip therein to stably contact a heat dissipation structure and avoid skewness due to improper fastening.

A power module of the disclosure includes a main housing and at least one assembling component. The main housing has at least one side wall and at least two ribs extending from the side wall. The assembling component includes a main section and two bending sections. The main section is located between the two ribs and includes a central portion, at least one movable component, and a peripheral portion. The central portion has a fastening portion, the peripheral portion surrounds the central portion, and the movable component is connected between the central portion and the peripheral portion. The two bending sections are respectively connected to two opposite sides of the peripheral portion and are respectively embedded in the two ribs.

In an embodiment of the disclosure, each of the bending sections is perpendicular to the main section.

In an embodiment of the disclosure, the central portion is in a ring form.

In an embodiment of the disclosure, a number of the movable component is plural, and the movable components have an elastic force and surround the central portion.

In an embodiment of the disclosure, the movable components are symmetrical around a center of the fastening portion.

In an embodiment of the disclosure, each of the bending sections has a plurality of holes.

In an embodiment of the disclosure, an end of the peripheral portion is embedded in the side wall.

In an embodiment of the disclosure, the power module includes a power element. The power element is disposed in the main housing and is closely pressed against a heat dissipation structure by the side wall. When a fastening member passes through the fastening portion and fastens the assembling component to the heat dissipation structure against an elastic force of the movable component, the power element is closely pressed against the heat dissipation structure through the main housing which is driven by the elastic force of the movable component.

In an embodiment of the disclosure, when the fastening member fastens the assembling component to the heat dissipation structure, the side wall is close to the heat dissipation structure, and there is a gap between the at least two ribs and the heat dissipation structure.

In an embodiment of the disclosure, a number of the at least one assembling component is two, and the two assembling components are respectively located on two opposite sides of the main housing.

A power module of the disclosure includes a main housing and at least one assembling component. The main housing has at least one side wall. The assembling component includes a main section, two first bending sections, and two second bending sections. The main section includes a central portion, at least one movable component, and a peripheral portion. The central portion has a fastening portion, the peripheral portion surrounds the central portion, and the movable component is connected between the central portion and the peripheral portion. The two first bending sections are respectively connected to two opposite sides of the peripheral portion, and the two second bending sections are respectively connected to the two first bending sections and are embedded in the side wall.

In an embodiment of the disclosure, each of the first bending sections is perpendicular to the main section.

In an embodiment of the disclosure, each of the second bending sections is perpendicular to the main section.

In an embodiment of the disclosure, the central portion is in a ring form.

In an embodiment of the disclosure, a number of the movable component is plural, and the movable components have an elastic force and surround the central portion.

In an embodiment of the disclosure, the movable components are symmetrical around a center of the fastening portion.

In an embodiment of the disclosure, each of the second bending sections has a plurality of holes.

In an embodiment of the disclosure, the power module includes a power element. The power element is disposed in the main housing and is closely pressed against a heat dissipation structure by the at least one side wall. When a fastening member passes through the fastening portion and fastens the assembling component to the heat dissipation structure against an elastic force of the movable component, the power element is closely pressed against the heat dissipation structure through the main housing which is driven by the elastic force of the movable component.

In an embodiment of the disclosure, when the fastening member fastens the assembling component to the heat dissipation structure, the side wall is close to the heat dissipation structure, and there is a gap between the first bending section and the heat dissipation structure.

In an embodiment of the disclosure, a number of the at least one assembling component is two, and the two assembling components are respectively located on two opposite sides of the main housing.

A power module of the disclosure includes a main housing, a power element, and at least one assembling component. The main housing has at least one side wall and at least two ribs extending from the side wall. The power element is disposed in the main housing and is closely pressed against a heat dissipation structure by the side wall. The assembling component includes a main section and two bending sections. The main section is located between the two ribs and includes a central portion, at least one movable component, and a peripheral portion. The central portion has a fastening portion, the peripheral portion surrounds the central portion, and the movable component is connected between the central portion and the peripheral portion. The two bending sections are respectively connected to two opposite sides of the peripheral portion and are respectively embedded in the two ribs.

A power module of the disclosure includes a main housing, a power element, and at least one assembling component. The main housing has at least one side wall. The power element is disposed in the main housing and is closely pressed against a heat dissipation structure by the side wall. The assembling component includes a main section, two first bending sections, and two second bending sections. The main section includes a central portion, at least one movable component, and a peripheral portion. The central portion has a fastening portion, the peripheral portion surrounds the central portion, and the movable component is connected between the central portion and the peripheral portion. The two first bending sections are respectively connected to two opposite sides of the peripheral portion, and the two second bending sections are respectively connected to the two first bending sections and are embedded in the side wall.

Based on the above, in the disclosure, the fastening portion of the assembling component is provided between the two ribs of the main housing or between the two first bending sections of the assembling component. Thereby, when a user passes the fastening member through the fastening portion to perform fastening, the two ribs of the main housing or the two first bending sections of the assembling component can guide the fastening member to avoid skewness of the fastening member. In addition, in the disclosure, the movable component of the assembling component is formed between the central portion having the fastening portion and the peripheral portion surrounding the central portion, and the movable component is not directly connected to the main housing. Therefore, when the movable component is deformed in an unexpected manner due to the skewness of the fastening member, it is possible to prevent the main housing from being also skewed, or it is possible to reduce the skewness of the main housing. When the user observes that the top surface of the fastening member is parallel to the peripheral portion, he or she can confirm that the fastening member is fastened properly without skewness. Therefore, it can be ensured that the power element in the main housing properly contacts the heat dissipation structure and has good heat dissipation efficiency.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
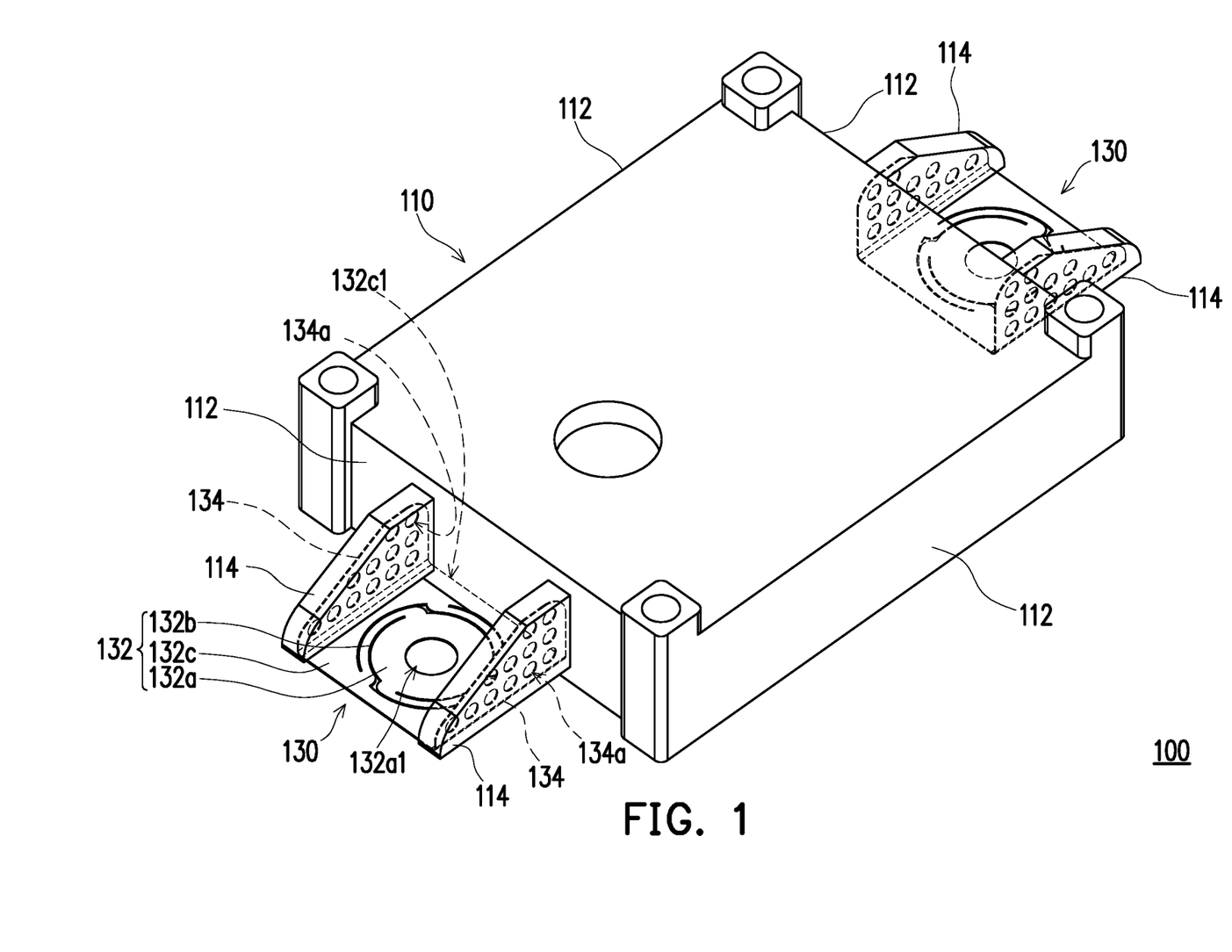
FIG. 1 is a perspective view showing a power module according to an embodiment of the disclosure.
Figure 2:
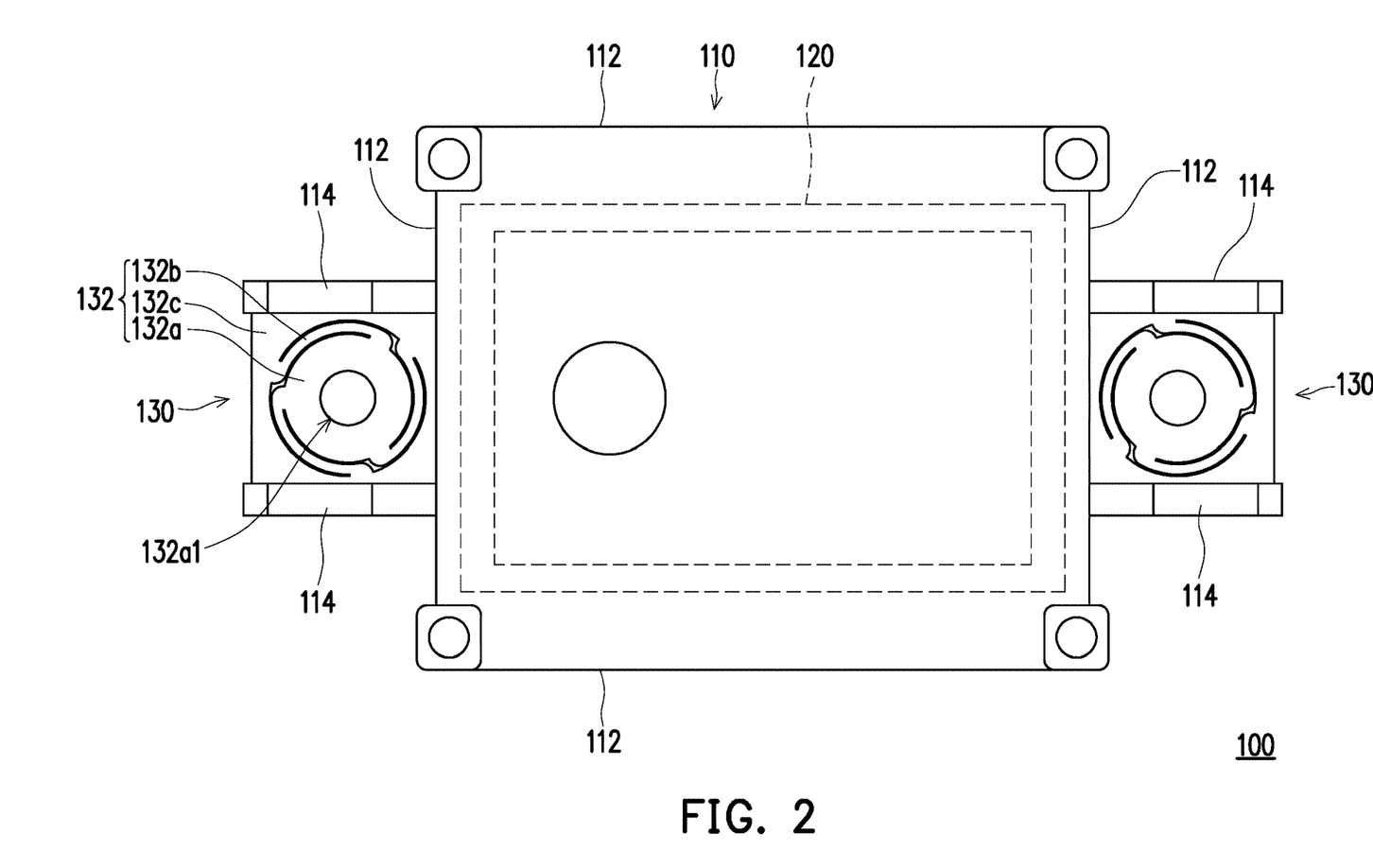
FIG. 2 is a top view showing the power module of FIG. 1.

FIG. 1 is a perspective view showing a power module according to an embodiment of the disclosure. FIG. 2 is a top view showing the power module of FIG. 1. Referring to FIG. 1 and FIG. 2, a power module 100 of this embodiment includes a main housing 110, a power element 120, and at least one assembling component 130 (shown as two herein). The main housing 110 has at least one side wall 112 (shown as multiple herein) and at least two ribs 114 (shown as four herein) extending from the side wall 112. Two ribs 114 are located on one side of the main housing 110, and two other ribs 114 are located on another side of the main housing 110. The power element 120 (shown in FIG. 2) is disposed in the main housing 110 and is surrounded by the side walls 112 to closely press against a heat dissipation structure 60. The power element 120 may include a power chip and a substrate carrying the power chip. The two assembling components 130 are respectively located on two opposite sides of the main housing 110 and respectively correspond to the two ribs 114 and the two other ribs 114.

Specifically, each assembling component 130 includes a main section 132 and two bending sections 134 (shown in FIG. 1 and FIG. 2). The main section 132 is located between the two ribs 114 and includes a central portion 132a, at least one movable component 132b (shown as multiple herein), and a peripheral portion 132c. The movable component 132b may have elasticity. The central portion 132a has a fastening portion 132a1 and is in a ring form, and the fastening portion 132a1 is, for example, a fastening hole. The peripheral portion 132c surrounds the central portion 132a, and each movable component 132b is connected between the central portion 132a and the peripheral portion 132c. The two bending sections 134 are respectively connected to two opposite sides of the peripheral portion 132c and are respectively embedded in the corresponding two ribs 114.

Figure 3:
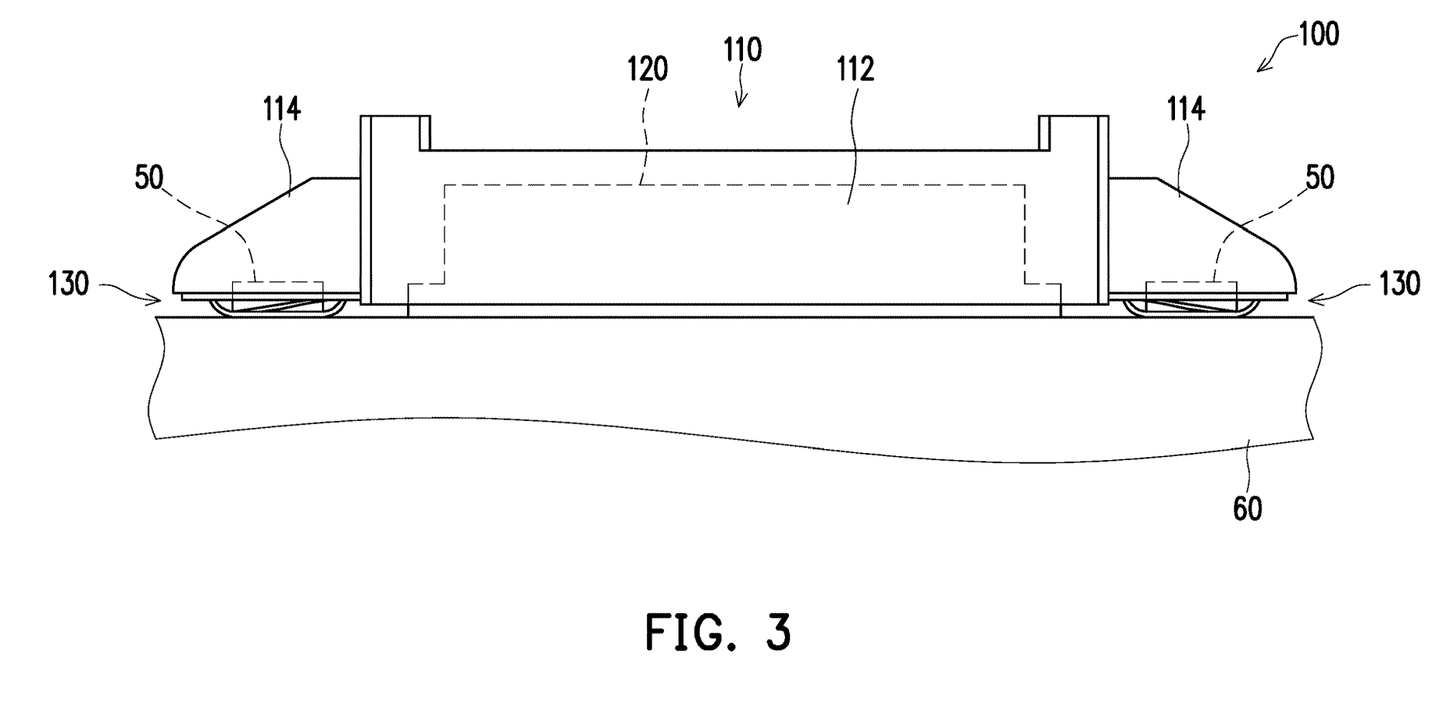
FIG. 3 is a side view showing the power module of FIG. 1 mounted on a heat dissipation structure.

FIG. 3 is a side view showing the power module of FIG. 1 mounted on the heat dissipation structure 60. As shown in FIG. 3, when a fastening member 50 passes through the fastening portion 132a1 (labeled in FIG. 2) and fastens the assembling component 130 to the heat dissipation structure 60 against the elastic force of the movable component 132b, the power element 120 is closely pressed against the heat dissipation structure 60 through the main housing 110 which is driven by the elastic force of the movable component 132b, so that the heat generated by the power element 120 can be conducted to the heat dissipation structure 60.

As described above, in this embodiment, the fastening portion 132a1 of the assembling component 130 is provided between the two ribs 114 of the main housing 110. Thereby, when a user passes the fastening member 50 through the fastening portion 132a1 to perform fastening, the two ribs 114 of the main housing 110 can guide the fastening member 50 to avoid skewness of the fastening member 50. In addition, as described above, in this embodiment, the movable component 132b of the assembling component 130 is formed between the central portion 132a having the fastening portion 132a1 and the peripheral portion 132c surrounding the central portion 132a, and the movable component 132b is not directly connected to the main housing 110. As a result, when the movable component 132b is deformed in an unexpected manner due to the skewness of the fastening member 50 and/or the uneven fastening force of the two fastening members 50, it is possible to prevent the main housing 110 from being also skewed, or it is possible to reduce the skewness of the main housing 110. Therefore, it can be ensured that the power element 120 in the main housing 110 properly contacts the heat dissipation structure 60 and has good heat dissipation efficiency.

Further, in each assembling component 130 of this embodiment, as shown in FIG. 2, the movable components 132b surround the central portion 132a and are symmetrical around the center of the fastening portion 132a1. Therefore, if the fastening member 50 for fastening the assembling component 130 is not skewed, the top surface of the fastening member 50 will be parallel to the peripheral portion 132c, which is convenient for the user to observe. Conversely, if the fastening member 50 for fastening the assembling component 130 is skewed, the top surface of the fastening member 50 will be skewed with respect to the peripheral portion 132c. Therefore, once the user observes that the top surface of the fastening member 50 is skewed with respect to the peripheral portion 132c, he or she can easily determine that the fastening member 50 is skewed and needs to be fastened again.

Referring to FIG. 1, in the assembling component 130 of this embodiment, each bending section 134 is perpendicular to the main section 132. Therefore, the fastening force of the fastening member 50 is perpendicular to the extending direction of each bending section 134, so that each bending section 134 is less likely to be deformed in an unexpected manner due to the fastening force. In addition, each bending section 134 of this embodiment has a plurality of holes 134a, so as to be firmly embedded in the corresponding rib 114 through the holes 134a. Moreover, by forming the holes 134a in each bending section 134, the weights of the assembling component 130 and the power module 100 including the same can be reduced, and the degree of thermal deformation of each bending section 134 can be reduced.

As shown in FIG. 1, an end 132c1 of the peripheral portion 132c of this embodiment is embedded in the side wall 112, so that the assembling component 130 is firmly combined with the main housing 110. On the other hand, the bottom end of the rib 114 in this embodiment is not flush with the bottom end of the side wall 112. Therefore, when the assembling component 130 is fastened to the heat dissipation structure 60 through the fastening member 50 as shown in FIG. 3, there is a gap between the rib 114 and the heat dissipation structure 60. Accordingly, it is possible to prevent the rib 114 from contacting the heat dissipation structure 60 so that the bottom end of the side wall 112 and the bottom surface of the power element 120 could not be properly supported on the heat dissipation structure 60.

Figure 4:
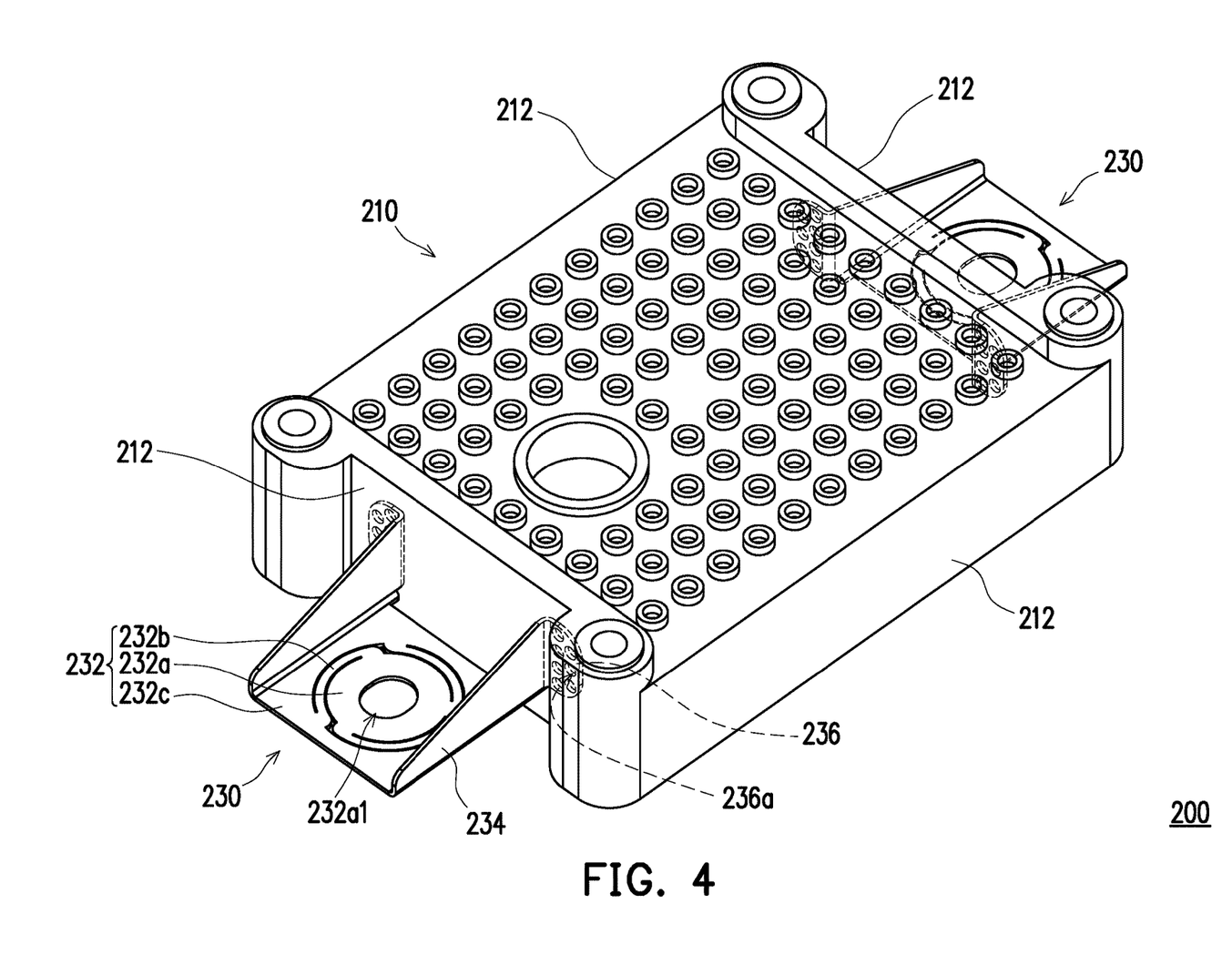
FIG. 4 is a perspective view showing a power module according to another embodiment of the disclosure.
Figure 5:
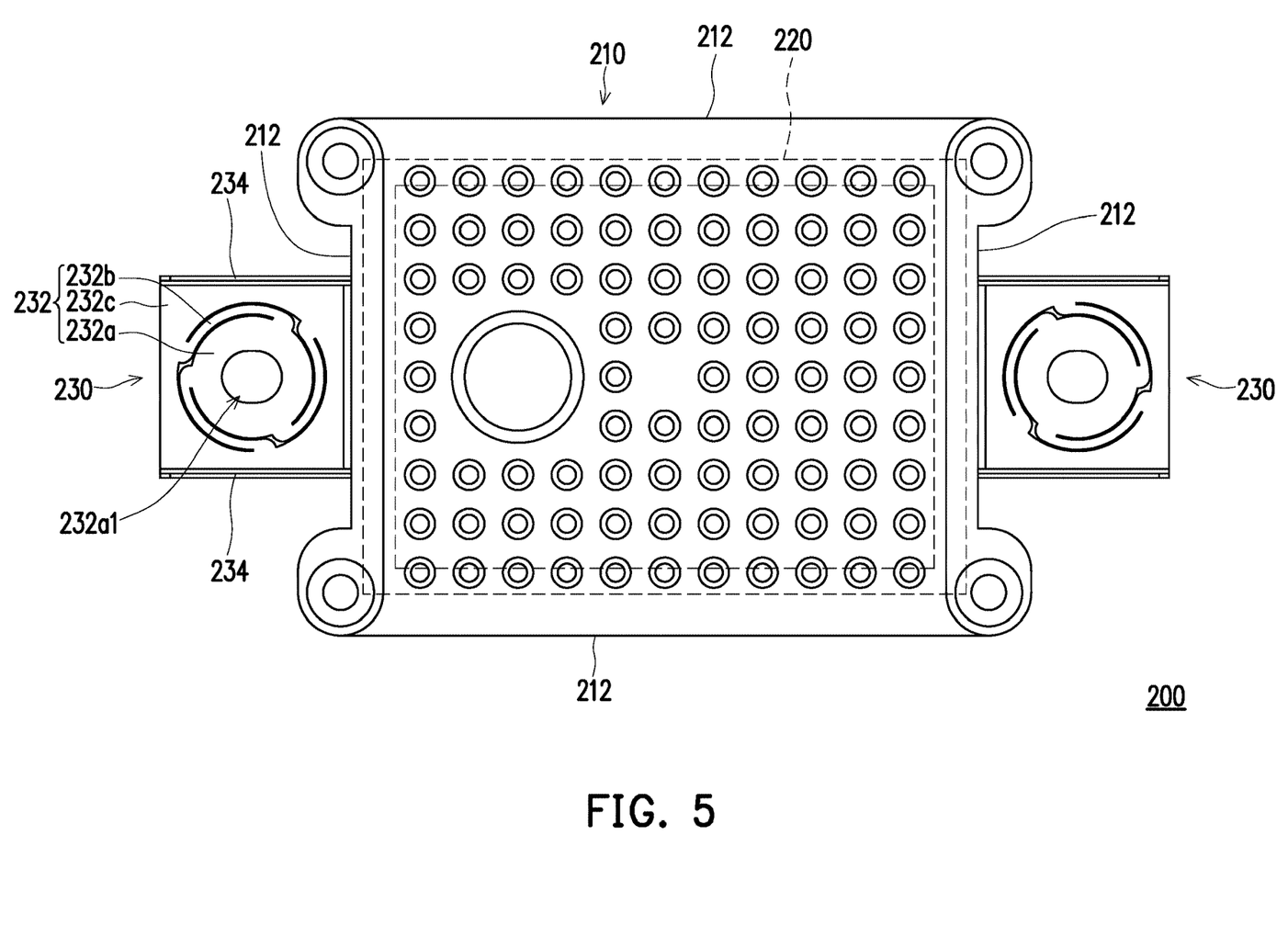
FIG. 5 is a top view showing the power module of FIG. 4.

FIG. 4 is a perspective view showing a power module according to another embodiment of the disclosure. FIG. 5 is a top view showing the power module of FIG. 4. Referring to FIG. 4 and FIG. 5, a power module 200 of this embodiment includes a main housing 210, a power element 220, and at least one assembling component 230 (shown as two herein). The main housing 210 has at least one side wall 212 (shown as multiple herein). The power element 220 (shown in FIG. 5) is disposed in the main housing 210 and is surrounded by the side walls 212 to press against a heat dissipation structure 60. The power element 220 may include a power chip and a substrate carrying the power chip. The two assembling components 230 are respectively located on two opposite sides of the main housing 210.

Specifically, each assembling component 230 includes a main section 232, two first bending sections 234, and two second bending sections 236 (shown in FIG. 4). The main section 232 includes a central portion 232a, at least one movable component 232b (shown as multiple herein), and a peripheral portion 232c. The central portion 232a has a fastening portion 232a1 and is in a ring form, and the peripheral portion 232c surrounds the central portion 232a. Each movable component 232b is connected between the central portion 232a and the peripheral portion 232c. The two first bending sections 234 are respectively connected to two opposite sides of the peripheral portion 232c, and the two second bending sections 236 are respectively connected to the two first bending sections 234 and are embedded in the side wall 212.

Figure 6:
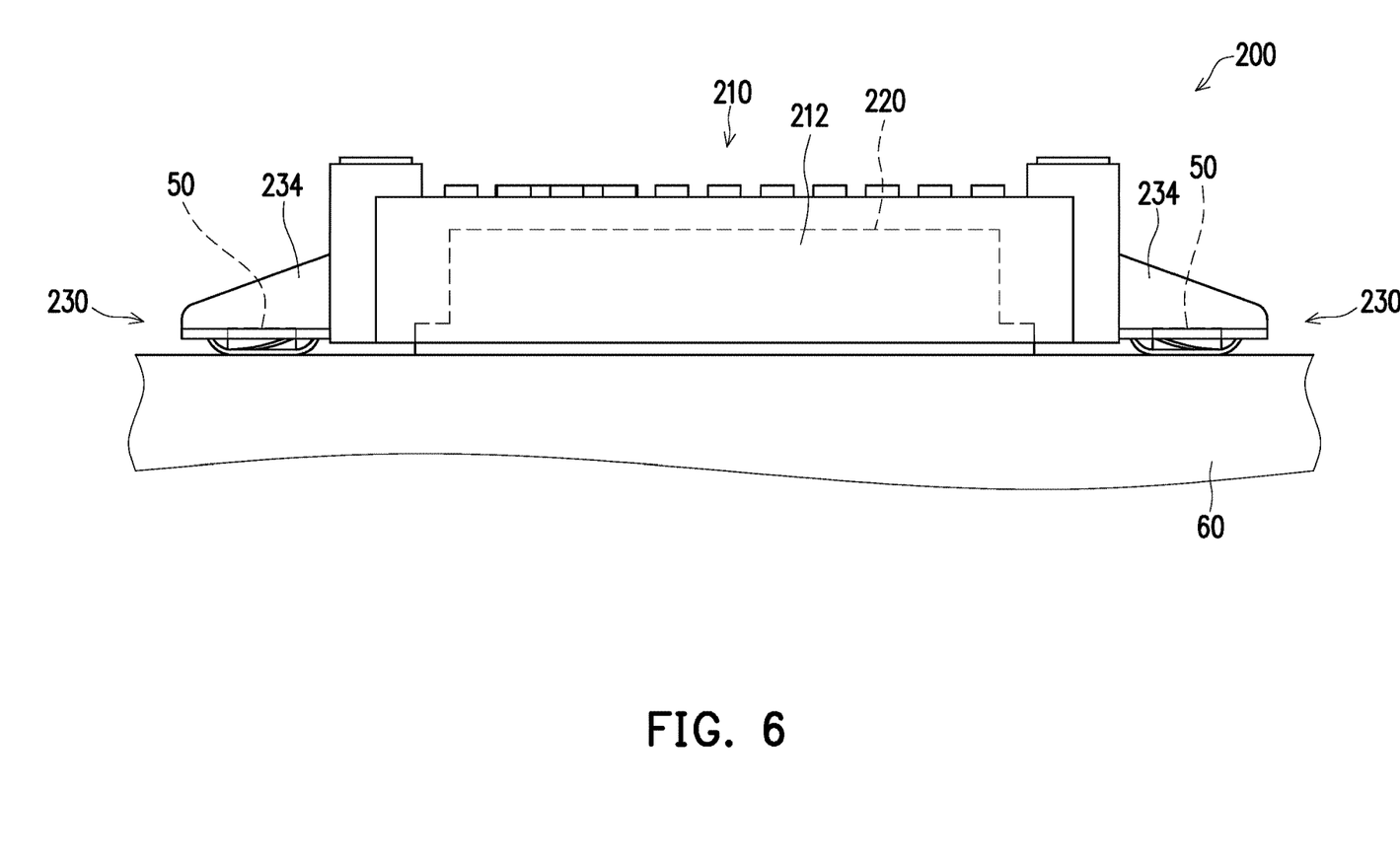
FIG. 6 is a side view showing the power module of FIG. 4 mounted on a heat dissipation structure.

FIG. 6 is a side view showing the power module of FIG. 4 mounted on the heat dissipation structure 60. As shown in FIG. 6, when a fastening member 50 passes through the fastening portion 232a1 (labeled in FIG. 4 and FIG. 5) and fastens the assembling component 230 to the heat dissipation structure 60 against the elastic force of the movable component 232b, the power element 220 is closely pressed against the heat dissipation structure 60 through the main housing 210 which is driven by the elastic force of the movable component 232b, so that the heat generated by the power element 220 can be conducted to the heat dissipation structure 60.

As described above, in this embodiment, the fastening portion 232a1 of the assembling component 230 is provided between the two first bending sections 234 of the assembling component 230. Thereby, when a user passes the fastening member 50 through the fastening portion 232a1 to perform fastening, the two first bending sections 234 of the assembling component 230 can guide the fastening member 50 to avoid skewness of the fastening member 50. In addition, as described above, in this embodiment, the movable component 232b of the assembling component 230 is formed between the central portion 232a having the fastening portion 232a1 and the peripheral portion 232c surrounding the central portion 232a, and the movable component 232b is not directly connected to the main housing 210. As a result, when the movable component 232b is deformed in an unexpected manner due to the skewness of the fastening member 50 and/or the uneven fastening force of the two fastening members 50, it is possible to prevent the main housing 210 from being also skewed, or it is possible to reduce the skewness of the main housing 210. Therefore, it can be ensured that the power element 220 in the main housing 210 properly contacts the heat dissipation structure 60 and has good heat dissipation efficiency.

Further, in each assembling component 230 of this embodiment, as shown in FIG. 5, the movable components 232b surround the central portion 232a and are symmetrical around the center of the fastening portion 232a1. Therefore, if the fastening member 50 for fastening the assembling component 230 is not skewed, the top surface of the fastening member 50 will be parallel to the peripheral portion 232c. Conversely, if the fastening member 50 for fastening the assembling component 230 is skewed, the top surface of the fastening member 50 will be skewed with respect to the peripheral portion 232c. Therefore, once the user observes that the top surface of the fastening member 50 is skewed with respect to the peripheral portion 232c, he or she can easily determine that the fastening member 50 is skewed and needs to be fastened again.

Referring to FIG. 4, in the assembling component 230 of this embodiment, each first bending section 234 is perpendicular to the main section 232, and each second bending section 236 is also perpendicular to the main section 232. Therefore, the fastening force of the fastening member 50 is perpendicular to the extending direction of each first bending section 234 and is perpendicular to the extending direction of each second bending section 236. As a result, each first bending section 234 and each second bending section 236 are less likely to be deformed in an unexpected manner due to the fastening force. In addition, each second bending section 236 of this embodiment has a plurality of holes 236a, so as to be firmly embedded in the side wall 212 through the holes 236a. Moreover, by forming the holes 236a in each second bending section 236, the weights of the assembling component 230 and the power module 200 including the same can be reduced, and the degree of thermal deformation of each second bending section 236 can be reduced.

As shown in FIG. 4, the bottom end of the assembling component 230 of this embodiment is not flush with the bottom end of the side wall 212. Therefore, when the assembling component 230 is fastened to the heat dissipation structure 60 through the fastening member 50 as shown in FIG. 6, there is a gap between the first bending section 234 and the heat dissipation structure 60. Accordingly, the first bending section 234 can be prevented from contacting the heat dissipation structure 60 so that the bottom end of the side wall 212 and the bottom surface of the power element 220 could not be properly supported on the heat dissipation structure 60.

Figure 7:
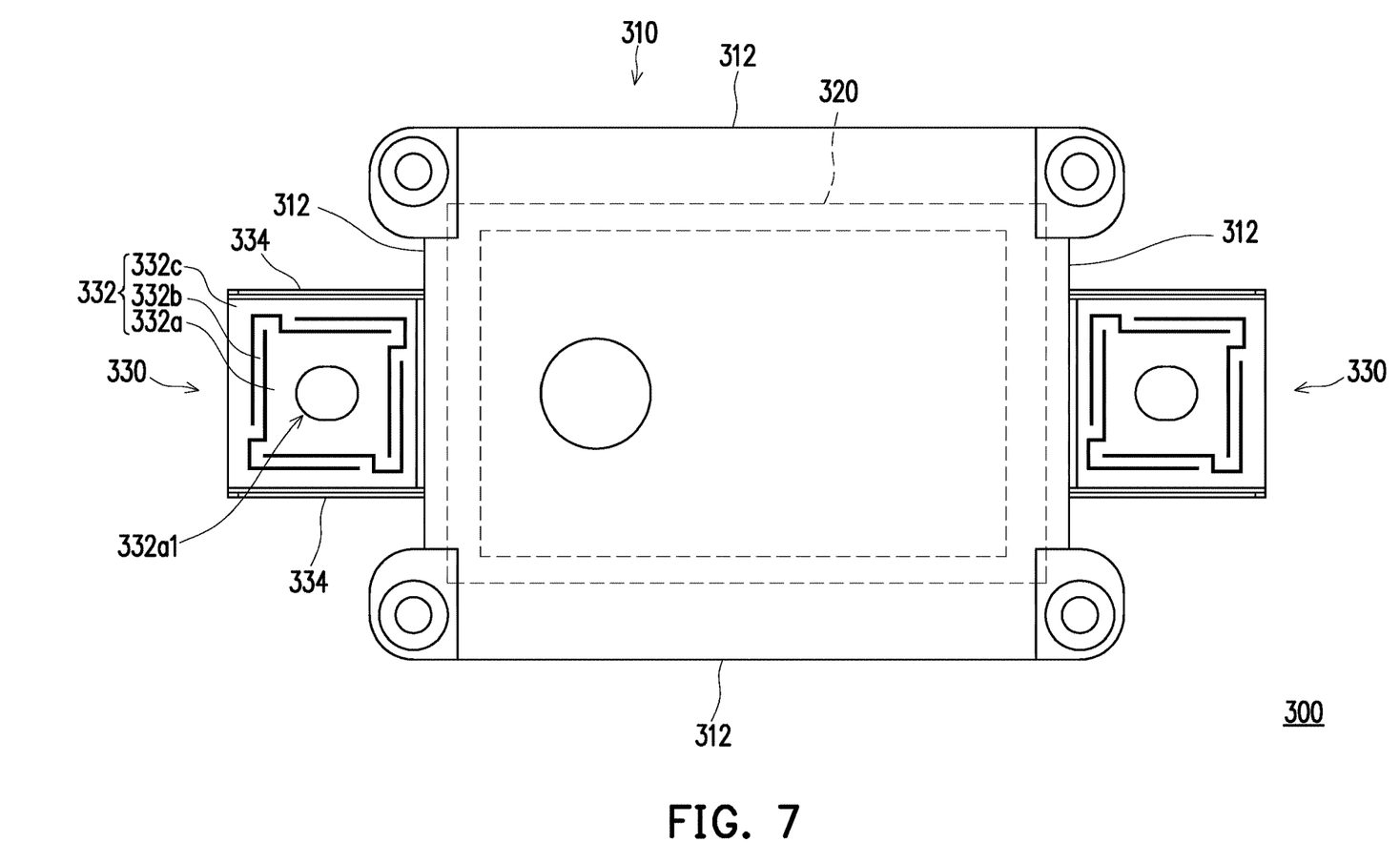
FIG. 7 is a top view showing a power module according to another embodiment of the disclosure.

FIG. 7 is a top view showing a power module according to another embodiment of the disclosure. In a power module 300 of FIG. 7, the configurations and functions of a main housing 310, a side wall 312, a power element 320, an assembling component 330, a main section 332, a central portion 332a, a fastening portion 332a1, a movable component 332b, a peripheral portion 332c, and a first bending section 334 are similar to the configurations and functions of the main housing 210, the side wall 212, the power element 220, the assembling component 230, the main section 232, the central portion 232a, the fastening portion 232a1, the movable component 232b, the peripheral portion 232c, and the first bending section 234 in FIG. 5, which will not be repeatedly described herein. The difference between the power module 300 and the power module 200 lies in that the central portion 332a and the movable component 332b form a rectangular structure, while the central portion 232a and the movable component 232b of FIG. 5 form a circular structure.

In summary of the above, in the disclosure, the fastening portion of the assembling component is provided between the two ribs of the main housing or between the two first bending sections of the assembling component. Thereby, when the user passes the fastening member through the fastening portion to perform fastening, the two ribs of the main housing or the two first bending sections of the assembling component can guide the fastening member to avoid skewness of the fastening member. In addition, in the disclosure, the movable component of the assembling component is formed between the central portion having the fastening portion and the peripheral portion surrounding the central portion, and the movable component is not directly connected to the main housing. Therefore, when the movable component is deformed in an unexpected manner due to the skewness of the fastening member, it is possible to prevent the main housing from being also skewed, or it is possible to reduce the skewness of the main housing. When the user observes that the top surface of the fastening member is parallel to the peripheral portion, he or she can confirm that the fastening member is fastened properly without skewness. Therefore, it can be ensured that the power element in the main housing properly contacts the heat dissipation structure and has good heat dissipation efficiency.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power module with housing having bending sections, adapted to fastening members, the power module with housing having bending sections comprising:
    a main housing having at least one side wall and at least two ribs extending from the at least one side wall; and
    at least one assembling component comprising a main section and two bending sections, wherein the main section is located between the at least two ribs, one of the two ribs is parallel to the other rib and perpendicular to the main section, and the main section comprises a central portion having a fastening portion in a plane corresponding to at least one fastening member and a peripheral portion surrounding the fastening portion in the same plane as the central portion, the peripheral portion comprising at least two movable components that respectively extend to a rim of the central portion between the central portion and the peripheral portion from a top view, one of the two movable components separated from the other movable components, wherein both the two bending sections are respectively connected to two opposite sides of the peripheral portion and are respectively embedded in the two ribs.

2. The power module according to claim 1, wherein each of the bending sections is a component that is perpendicular to the main section inside one of both the two ribs.

3. The power module according to claim 1, wherein the central portion is in a ring form, if the at least one fastening member is skewed, the top surface of the at least one fastening member is skewed towards the peripheral portion, and if the at least one fastening member is not skewed through the fastening portion, the top surface of the at least one fastening member is parallel to the peripheral portion.

4. The power module according to claim 1, wherein a number of both the two movable components are plural, and the movable components have an elastic force and surround the central portion.

5. The power module according to claim 4, wherein the movable components are symmetrical around a center of the fastening portion.

6. The power module according to claim 1, wherein each of the bending sections has a plurality of holes.

7. The power module according to claim 1, wherein an end of the peripheral portion is embedded in the at least one side wall.

8. The power module according to claim 1, comprising a power element, wherein the power element is disposed in the main housing and is closely pressed against a heat dissipation structure by the at least one side wall, wherein when a fastening member passes through the fastening portion and fastens the at least one assembling component to the heat dissipation structure against an elastic force of the at least one movable component, the power element is closely pressed against the heat dissipation structure through the main housing which is driven by the elastic force of the at least one movable component.

9. The power module according to claim 8, wherein when the fastening member fastens the at least one assembling component to the heat dissipation structure, the at least one side wall is close to the heat dissipation structure, and there is a gap between the at least two ribs and the heat dissipation structure.

10. The power module according to claim 1, wherein a number of the at least one assembling component is two, and the two assembling components are respectively located on two opposite sides of the main housing.

11. A power module with housing having bending sections, adapted to fastening members, the power module with housing having bending sections comprising:
a main housing having at least one side wall; and
at least one assembling component comprising a main section, two first bending sections, and two second bending sections, wherein the main section comprises a central portion having a fastening portion corresponding to at least one fastening member and a peripheral portion surrounding the fastening portion from a top view, the peripheral portion comprising at least two movable components that respectively extend to a rim of the central portion between the central portion and the peripheral portion from the top view, one of the two movable components separated from the other movable components, wherein the two first bending sections are respectively connected to two opposite sides of the peripheral portion, and the two second bending sections are respectively connected to the two first bending sections and are embedded in the at least one side wall.

12. The power module according to claim 11, wherein each of the first bending sections is a component that is perpendicular to the main section.

13. The power module according to claim 11, wherein each of the second bending sections is a component that is perpendicular to the main section.

14. The power module according to claim 11, wherein the central portion is in a ring form.

15. The power module according to claim 11, wherein a number of both the two movable components are plural, and the movable components have an elastic force and surround the central portion.

16. The power module according to claim 15, wherein the movable components are symmetrical around a center of the fastening portion.

17. The power module according to claim 11, wherein each of the second bending sections has a plurality of holes.

18. The power module according to claim 11, comprising a power element, wherein the power element is disposed in the main housing and is closely pressed against a heat dissipation structure by the at least one side wall, wherein when a fastening member passes through the fastening portion and fastens the at least one assembling component to the heat dissipation structure against an elastic force of the at least one movable component, the power element is closely pressed against the heat dissipation structure through the main housing which is driven by the elastic force of the at least one movable component.

19. The power module according to claim 18, wherein when the fastening member fastens the at least one assembling component to the heat dissipation structure, the at least one side wall is close to the heat dissipation structure, and there is a gap between the first bending section and the heat dissipation structure.

20. The power module according to claim 11, wherein a number of the at least one assembling component is two, and the two assembling components are respectively located on two opposite sides of the main housing.

21. A power module with housing having bending sections, adapted to fastening members, the power module with housing having bending sections comprising:
a main housing having at least one side wall and at least two ribs extending from the at least one side wall;
a power element disposed in the main housing and closely pressed against a heat dissipation structure by the at least one side wall; and
at least one assembling component comprising a main section and two bending sections, wherein the main section is located between the at least two ribs, one of the two ribs is parallel to the other rib and perpendicular to the main section, and the main section comprises a central portion having a fastening portion corresponding to at least one fastening member and a peripheral portion surrounding the fastening portion from a top view, the peripheral portion comprising at least two movable components that respectively extend to a rim of the central portion between the central portion and the peripheral portion from the top view, one of the two movable components separated from the other movable components, wherein the two bending sections are respectively connected to two opposite sides of the peripheral portion and are respectively embedded in the at least two ribs.

22. A power module with housing having bending sections, adapted to fastening members, the power module with housing having bending sections comprising:
a main housing having at least one side wall;
a power element disposed in the main housing and closely pressed against a heat dissipation structure by the at least one side wall; and
at least one assembling component comprising a main section, two first bending sections, and two second bending sections, wherein the main section comprises a central portion having a fastening portion corresponding to at least one fastening member and a peripheral portion surrounding the fastening portion from a top view, the peripheral portion comprising at least two movable components that respectively extend to a rim of the central portion between the central portion and the peripheral portion from the top view, one of the at least two movable components separated from the other one of the at least two movable components, wherein the two first bending sections are respectively connected to two opposite sides of the peripheral portion, and the two second bending sections are respectively connected to the two first bending sections and are embedded in the at least one side wall.

* * * * *